United States Patent [19]
Skebe et al.

[11] Patent Number: 5,610,079
[45] Date of Patent: Mar. 11, 1997

[54] SELF-BIASED MOAT FOR PARASITIC CURRENT SUPPRESSION IN INTEGRATED CIRCUITS

[75] Inventors: Gerard G. Skebe, Eastlake; Steven M. Galecki, Concord Township, both of Ohio

[73] Assignee: Reliance Electric Industrial Company, Cleveland, Ohio

[21] Appl. No.: 491,669

[22] Filed: Jun. 19, 1995

[51] Int. Cl.$^6$ ................................ H01L 49/00
[52] U.S. Cl. .................... 437/6; 437/40; 437/41; 437/917
[58] Field of Search ................ 437/6, 31, 154, 437/40–41, 53, 8, 917

[56] References Cited

U.S. PATENT DOCUMENTS

| | | | |
|---|---|---|---|
| 3,590,345 | 6/1971 | Brewer | 317/235 |
| 3,931,634 | 1/1976 | Knight | 357/48 |
| 4,245,209 | 1/1981 | Bertotti et al. | 338/217 |
| 4,266,233 | 5/1981 | Bertotti et al. | 357/22 |
| 4,319,262 | 3/1982 | Bertotti et al. | 357/35 |
| 4,571,505 | 2/1986 | Eaton, Jr. | 307/297 |

(List continued on next page.)

OTHER PUBLICATIONS

"Microcontroller Switches 5–A, 60–V Current Pulses", Goodenough, *Electronic Design*, Oct. 14, 1993, pp. 71–79.
"A Monolithic Quad Line Driver For Industrial Applications", Gariboldi, et al. IEEE Journal of Solid–State Circuits, V. 29, No. 8, Aug. 1994, pp. 957–962.

"Power Integrated Circuits, Physics, Design, and Applications", Editor antognetti, Univ. of Genoa, Sect. 4.7—Parasitics in PICs, F. Bertotti, pp. 4.19–4.25, publishing date unknown.

*Primary Examiner*—H. Jey Tsai
*Attorney, Agent, or Firm*—Michael E. Hudzinski; John M. Miller; John J. Horn

[57] ABSTRACT

A substrate (10) of a semiconductor device includes a power section (12) and a control section (14). The power section includes doped regions (16, 18, 20) and terminals (22, 24, 26) which define power devices such as transistors or SCRs. The control region also includes doped areas including a parasitic collector (32). A minority carrier current (62) flows from the doped regions of the power section to the collector of the control section when the power device to substrate junction is forward-biased. A moat assembly (40) includes a first doped region (42) between the doped regions of the power and control sections. An electrical connection (46) connects the moat first doped region (42) with a moat second doped region (44). The self-biased moat assembly is isolated from ground such that it is self-biased negative in accordance with internal operating conditions of the semiconductor device. The minority charge carriers are collected by the moat first doped region. A current is created that flows from the first doped region through the electrical conductor to the moat second doped region. The majority carriers flowing through the substrate from the first section under the first doped region toward the second doped region. The majority carriers cause a voltage drop under the moat first doped region that results in an electric field that forms a minority carrier gradient which reduces parasitic minority carrier current flowing to the control section (14).

8 Claims, 5 Drawing Sheets

U.S. PATENT DOCUMENTS

| | | | |
|---|---|---|---|
| 4,580,330 | 4/1986 | Pollack et al. | 29/576 |
| 4,614,962 | 9/1986 | Bertotti et al. | 357/38 |
| 4,631,561 | 12/1986 | Foroni et al. | 357/13 |
| 4,635,087 | 1/1987 | Birrittella et al. | 357/44 |
| 4,641,171 | 2/1987 | Bertotti et al. | 357/46 |
| 4,641,172 | 2/1987 | Iwatani | 357/48 |
| 4,663,647 | 5/1987 | Bertotti et al. | 357/51 |
| 4,672,235 | 6/1987 | Villa et al. | 307/255 |
| 4,682,197 | 7/1987 | Villa et al. | 357/36 |
| 4,725,810 | 2/1988 | Foroni et al. | 338/226 |
| 4,731,343 | 3/1988 | Beinvogl | 437/63 |
| 4,739,378 | 4/1988 | Ferrari et al. | 357/13 |
| 4,740,821 | 4/1988 | Bartotti et al. | 357/22 |
| 4,786,827 | 11/1988 | Gariboldi et al. | 307/300 |
| 4,829,344 | 5/1989 | Bertotti et al. | 357/13 |
| 4,862,242 | 8/1989 | Wildi et al. | 357/48 |
| 4,882,532 | 11/1989 | Gariboldi et al. | 323/222 |
| 4,887,141 | 12/1989 | Bertotti et al. | 357/36 |
| 4,887,142 | 12/1989 | Bertotti et al. | 357/43 |
| 4,890,149 | 12/1989 | Bertotti et al. | 357/48 |
| 4,899,098 | 2/1990 | Gariboldi | 323/277 |
| 4,910,159 | 3/1990 | Bertotti et al. | 437/31 |
| 5,021,860 | 6/1991 | Bertotti et al. | 357/48 |
| 5,119,263 | 6/1992 | Gariboldi et al. | 361/18 |
| 5,182,470 | 1/1993 | Gariboldi et al. | 307/296.4 |
| 5,185,649 | 2/1993 | Bertotti et al. | 357/43 |
| 5,204,273 | 4/1993 | Kuhnert et al. | 437/6 |
| 5,506,152 | 4/1996 | Whitney | 437/6 |

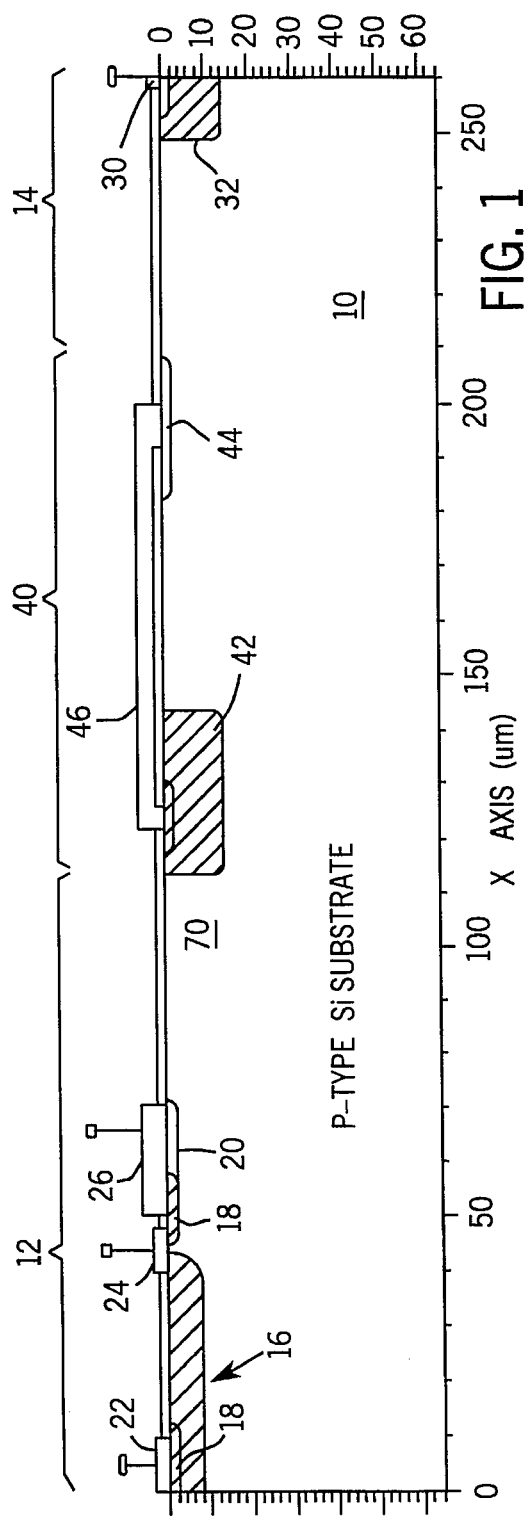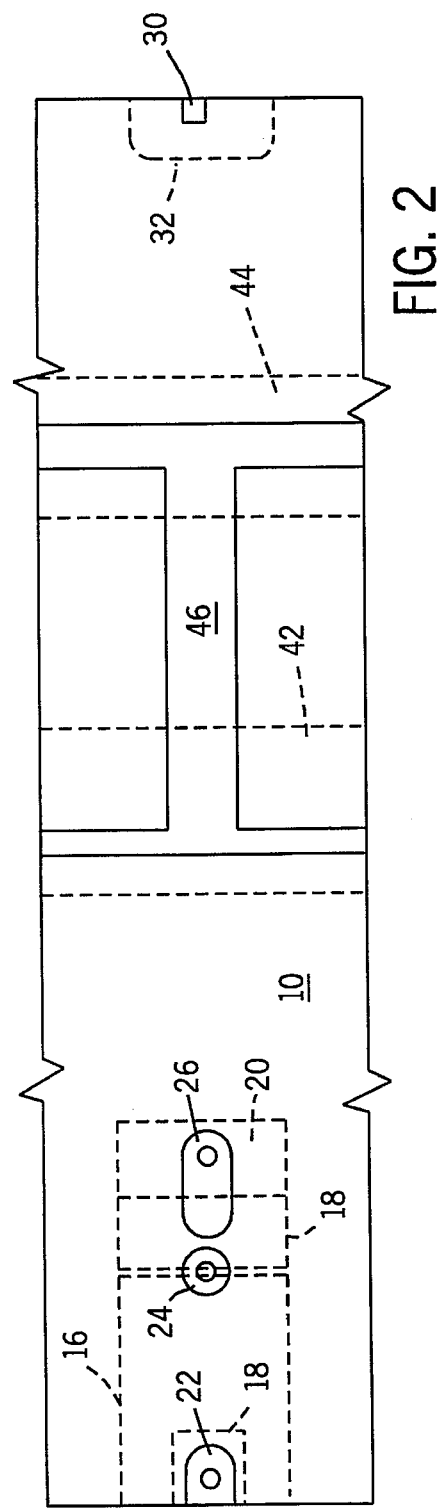

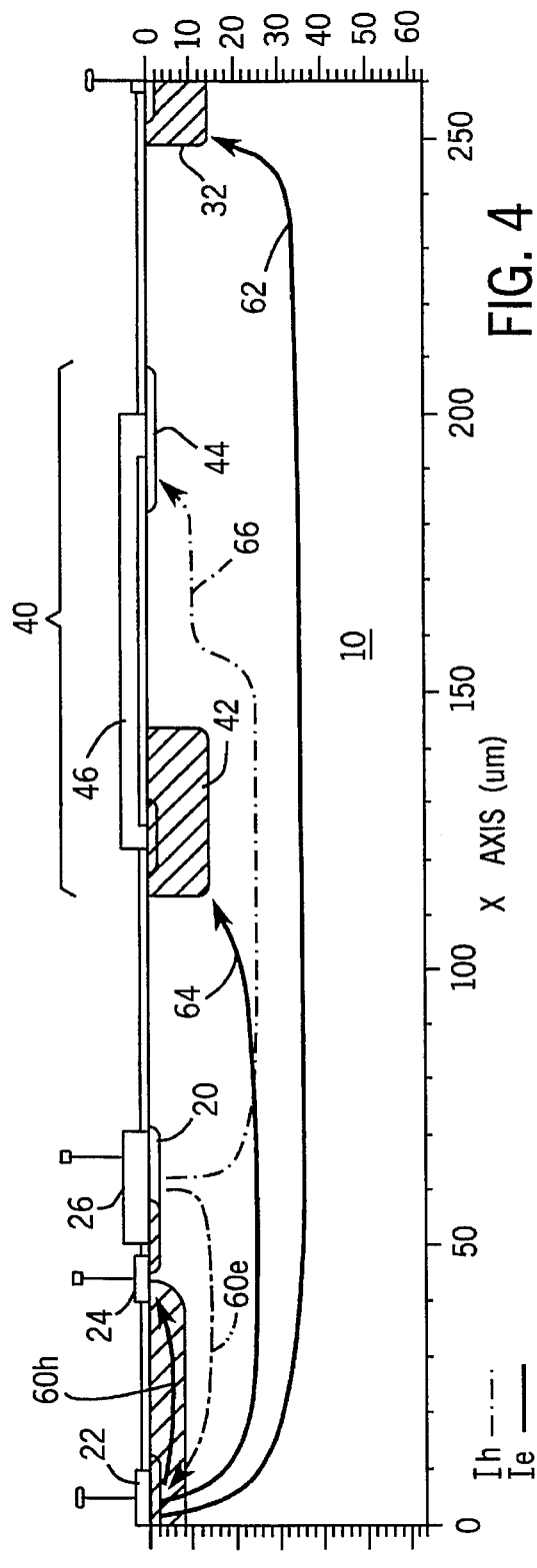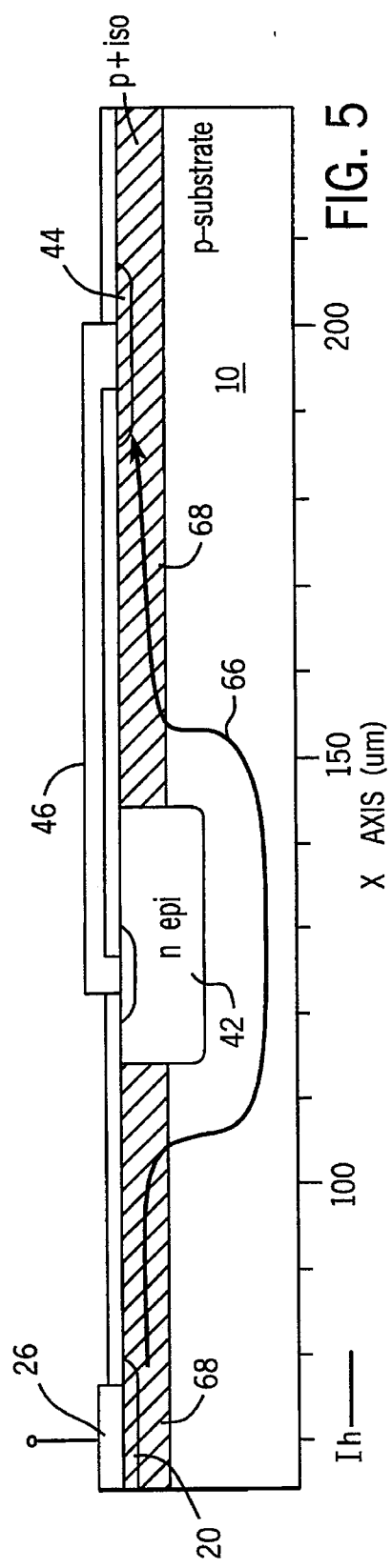

SELF-BIASED MOAT FOR PARASITIC CURRENT SUPPRESSION IN INTEGRATED CIRCUITS

BACKGROUND OF THE INVENTION

The present invention relates to integrated circuits. It finds particular application in conjunction with integrated circuits which provide high voltage power to electric motors and other inductive loads and will be described with particular reference thereto. However, it is to be appreciated that the present invention will also find application in conjunction with integrated circuits for other high and low voltage applications with inductive and non-inductive loads.

Heretofore, transistors, SCRs, diodes, and other discrete solid state components have commonly been used to control electric motors and other large inductive loads. One drawback of using discrete components has been that they are relatively space inefficient. Another drawback resides in high manufacturing and labor costs.

To overcome the drawbacks of discrete components, the power and control components have been fabricated in a single integrated circuit with a common substrate. Transistors and SCRs which provide power to inductive loads typically have a PN junction which becomes forward-biased, e.g., an NPN collector or a MOSFET drain is biased negatively. A high level of minority carriers are injected by the forward-biased junction. Under these conditions, a parasitic transistor or SCR formed with other doped regions on the common substrate becomes active.

One solution to minimize the effect of the parasitic device has been to create a moat or guard ring around the power components. That is, the minority carrier injector is surrounded by epitaxial and deep regions of the opposite dopant type. The moat is connected to ground. In this manner, some of the injected minority carriers or stray substrate currents are shunted to ground, limiting the interaction of the forward-biased node with other nodes that form parasitic transistors or SCRs. (See, for example, "Power Integrated Circuits: Physics, Design and Applications", Paolo Antognetti, Page 4 20, (1986).) Although grounded moats can reduce the parasitic currents by two or three orders of magnitude below the injected currents, significant parasitic currents still remain.

The present invention contemplates a new and improved minority carrier protection scheme for integrated circuits relying at least partially on junction isolation.

SUMMARY OF THE INVENTION

In accordance with one aspect of the present invention, an integrated circuit device is provided. The circuit device includes a substrate, a series of doped regions which define a first or power section, and a series of doped regions which define a second or control section. A self-biased moat assembly is defined between the power device and the control or other device.

More specifically, the self-biased moat assembly includes a first doped region, of opposite conductivity type to that of the substrate, located between and demarcating the doped regions of the first and second sections. A second region is doped to receive a flow of majority charge carriers from the substrate. The second doped region is disposed on a side of the first doped region toward the second section. An electrical conductor connects-the first and second doped regions. The first doped region collects a portion of the substrate minority carriers establishing a current. The current flows as majority carriers through the substrate from the first section under the first doped region toward the second doped region, thereby biasing the second doped region. The self-biased moat assembly is isolated from ground and controlled voltage sources such that the substrate minority carriers collected by the first doped region controls the bias on the moat device.

In accordance with another aspect of the present invention, a method of controlling parasitic current in a semiconductor device which includes a substrate and a moat assembly is provided. The substrate defines a first section having a plurality of doped regions that define power devices and a second section having at least one doped region. The doped regions of the first and second sections are biased at least intermittently such that minority carriers are injected into the substrate. The injected minority carriers cause a parasitic current to flow from the first section to the second section, thus causing the doped regions of the first and second sections to function as a parasitic device. The moat assembly includes a first doped region of opposite conductivity type to that of the substrate, between the first and second sections, a second doped region which receives a flow of majority charge carriers from the substrate, and an electrical conductor connecting the first and second doped regions. The self-biased moat assembly is isolated from ground and controlled voltage sources.

The method includes when the first and second sections are biased such that minority carriers are injected into the substrate causing a parasitic minority carrier current flow from the first section to the second section, i.e., the doped regions of the first and second sections function as a parasitic device, collecting a portion of the minority carriers from the substrate with the moat's first doped region. The carriers collected by the first doped region generate a current that flows via the electrical conductor to the second doped region. The current path is completed by the flow of majority carriers from the first section through the substrate under the moat's first doped region to the moat's second doped region. This majority carrier current establishes a voltage bias under the first doped region which inhibits and greatly reduces the parasitic minority current flow from the first section to the second section.

One advantage of the present invention resides in its simplicity. The moat is self-biased and self-controlling, requiring no external or added control circuitry.

Another advantage of the present invention is that it reduces parasitic minority charge flow from the first section to the second section.

Another advantage of the present invention is that it is effective to reduce parasitic minority charge flow, even in high voltage applications with inductive loads which tend to inject relatively large quantities of minority charge carriers into the substrate.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 1 is a cross-section of a power FET, moat, and low voltage collector in accordance with the present invention;

FIG. 2 is a top view of the integrated circuit of FIG. 1;

FIG. 4 is a cross-sectional view of the device of FIGS. 1 and 2 depicting electron current flow (Ie) and hole current flow (Ih);

FIG. 5 is a detailed cross-sectional view illustrating moat hole current flow (Ih) in the device of FIGS. 1 and 2;

DETAILED DESCRIPTION OF THE PREFERRED EMBODIMENTS

Figure 3:
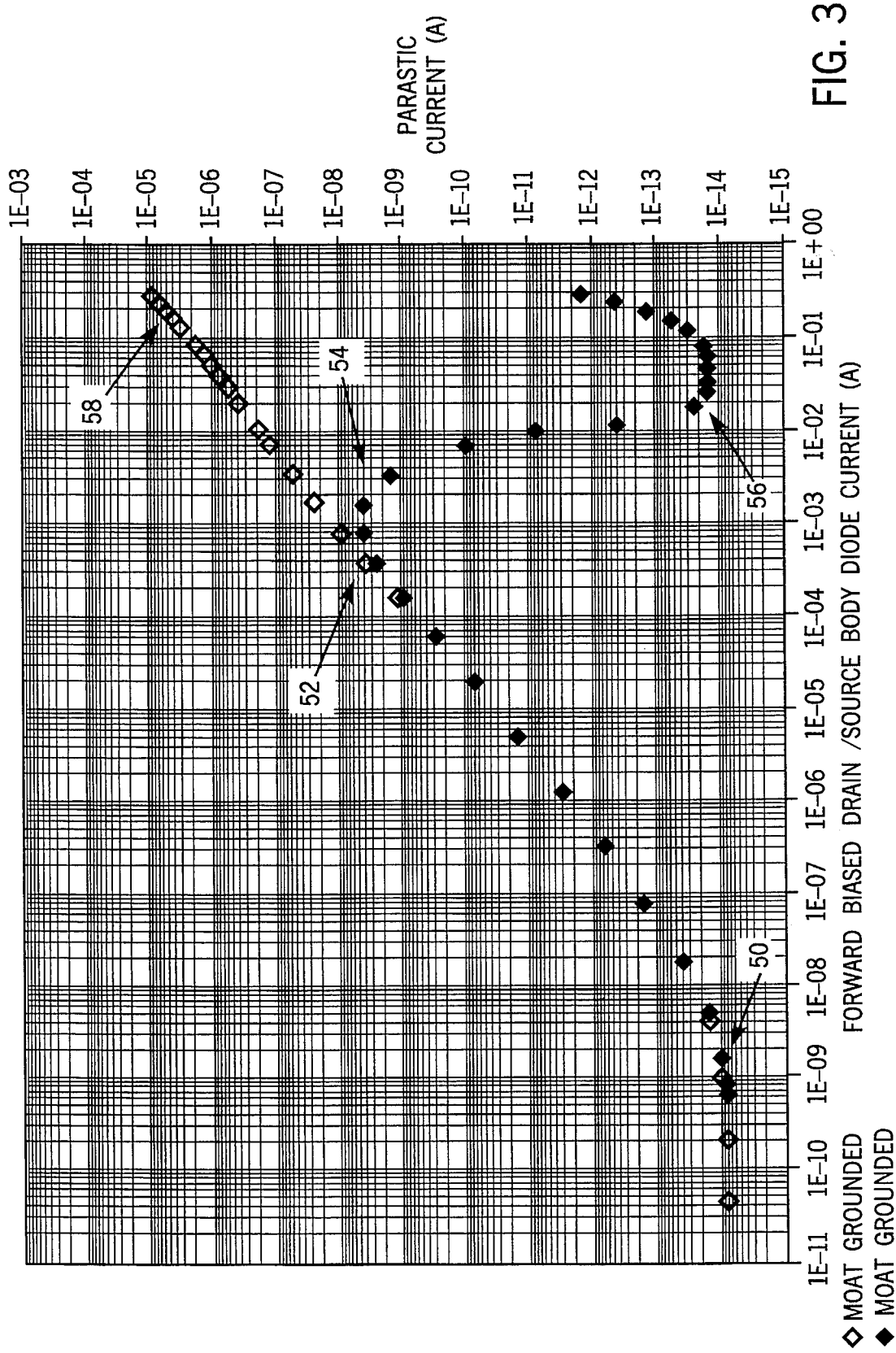
FIG. 3 is a graph of drain current versus parasitic current for the device of FIGS. 1 and 2.

With reference to FIGS. 1 and 2, a P-type silicon substrate 10 is divided into a first or power section 12 and a second or control section 14. The power section includes various doped regions 16, 18, 20 and electrical contacts to define transistors, SCRs, or other power devices. In the illustrated embodiment, the power device section 12 includes a drain contact 22, a gate contact 24, and a source/body contact 26. In the illustrated DMOS device, the doped regions include N+ doped regions 18 disposed under the drain contact 22 and the source contact 26, an N drain drift region 16, and a P+ doped region 20 under the source contact 26, as are known in the art. Other doped region patterns are also contemplated as are appropriate for other types of power devices. The second or control circuit section 14 in the illustration includes only a parasitic collector contact 30 and associated N-doped region 32 for simplicity of illustration. It is to be appreciated that numerous other circuit patterns and doped regions are typically present.

The power and control sections are separated by a self-biased moat assembly 40. The self-biased moat includes a first or N-doped region 42 which extends in a band that separates the power and control sections. The N-region may be a diffused well or an epitaxial pocket. The moat may completely surround one of the sections or merely extend from one end of the substrate to another between the two sections. A P-doped region 44 is defined on the control section side of the moat. An electrical connector 46 extends between the P and N-doped moat regions. The electrical node 46 is isolated or floating with respect to ground and all other external potentials. It is not connected through a low impedance path to ground, nor to a negative voltage source, nor to a positive voltage source.

With reference to FIG. 3, a curve 50 of filled diamonds illustrates the parasitic current collected by parasitic collector 32 versus the forward-biased drain 16/substrate 10 diode current. It will be noted that as the drain/substrate current increases, the parasitic current increases up to point 52. After point 52, the feedback-current in the self-biased moat assembly brings the parasitic current down several orders of magnitude to point 56. It might be noted from curve 58 (open diamonds), that if the moat assembly is connected to ground, the parasitic current continues to increase with the forward-biased drain 16/substrate 10 current and the reduced parasitic current advantage of the self-biasing moat is not achieved.

With reference to FIGS. 4 and 5, the reduction of parasitic collector current beyond point 52 of FIG. 3 is dependent on the epitaxial first doped region 42 of the moat collecting minority carriers. In the embodiment of FIG. 4, the holes are the majority carriers in the substrate and form a majority current Ih and electrons are the minority carriers which form a minority carrier current Ie, the drain 22 is biased negatively, the source 26 and the gate 24 are grounded, the self-biased moat assembly 40 is floating, and the collector 32 is biased positive. Under these conditions, there are three major components to the current flow. The largest current component is composed of an electron current 60e and hole current 60h associated with the forward-biased drain 16/substrate 10 diode flowing between the drain contact 22 and source/body contact 26. Second, minority carrier electrons flowing from the drain 22 to the control section form a parasitic current component 62 with the parasitic bipolar transistors and SCRs comprised of the collector 32 or other like-biased, doped regions. A third component includes an electron current 64 flowing to the moat first doped region 42 and a hole current 66 flowing below the moat first doped region 42 to the second doped region 44. The conductor 46 completes the current path.

The fedback majority carrier current 66 causes a self-bias voltage which reduces the minority carrier current 62 flowing to the collector 32. The moat feedback current 66 flows as majority carriers from the region 20 to the moat second doped region 44 and as minority carriers 64 move between the drain 16 and the moat first doped region 42.

The parasitic current 62 becomes the collector current of a parasitic NPN transistor formed by the power section drain 22, substrate 10, and N-epi collector region 32 of the low voltage control section 14. TABLE 1 lists typical material properties of a silicon substrate and epitaxy for a 400 volt process. Other material could be used for different voltage ratings.

TABLE 1

| | | |
|---|---|---|
| Substrate doping concentration | $N_A$ | $5 \times 10^{14}$ $cm^{-3}$ |
| Epitaxial doping concentration | $N_D$ | $2 \times 10^{15}$ $cm^{-3}$ |
| Minority carrier lifetime in epi | $\tau_h$ | 5 μsec |
| Minority carrier lifetime in substrate | $\tau_e$ | 3 μsec |
| Diffusivity for electrons | $D_e$ | 34 $cm^2$/sec |
| Diffusivity for holes | $D_h$ | 13 $cm^2$/sec |

Using the estimated values of minority carrier lifetime τ and diffusivity $D_h$ for holes and $D_e$ for electrons from TABLE 1, the diffusion length $L_h$ for holes and the diffusion length $L_e$ for electrons are:

$$L_h = \sqrt{D_h \tau} \cong 8 \times 10^{-3} \text{ cm} = 80 \text{ μm}, \quad (1)$$

$$L_e = \sqrt{D_e \tau} \cong 1.3 \times 10^{-2} \text{ cm} = 130 \text{ μm}. \quad (2)$$

These diffusion lengths are on the order of the physical dimensions, particularly the width, of the self-biased moat first doped region. The transistor action is established due to the physical closeness of the two junctions with respect to the diffusion length of the minority carriers.

The P-type substrate be represents the base region of the parasitic transistor. With the substrate grounded, the drain 16/substrate 10 junction becomes forward-biased and the substrate 10/collector 32 junction becomes reverse-biased. The lateral NPN parasitic transistor is in the active region of a common base configuration. The collector current under these conditions is related to the minority carrier distribution in the base region near the base/collector depletion region. Normally, increasing the forward-bias of the base/emitter junction increases the collector current by increasing the minority carrier gradient near the base/collector junction.

The N-type first diffusion region 42 of the moat acts as a collector of minority carrier electrons. This current is supplied by the majority carrier holes from the source 26. With reference to FIG. 5, the hole current 66 from the grounded source 26 drift down through a P+ isolation diffusion 68 across the higher resistivity substrate 10 and through the low resistivity P+ isolation to the moat second doped region 44. Once the level of injected minority carriers becomes high enough to result in a significant moat current, a voltage drop associated with the hole current flow through the high resistivity substrate establishes an electric field directly beneath the N-epi first doped region 42 of the moat. This electric field causes an electron drift current to flow which gives rise to a negative electron carrier gradient with respect to the x-axis in FIG. 4. The electron gradient results in lower parasitic currents as the electron carrier density near the collector in the second section is reduced.

Figure 6:
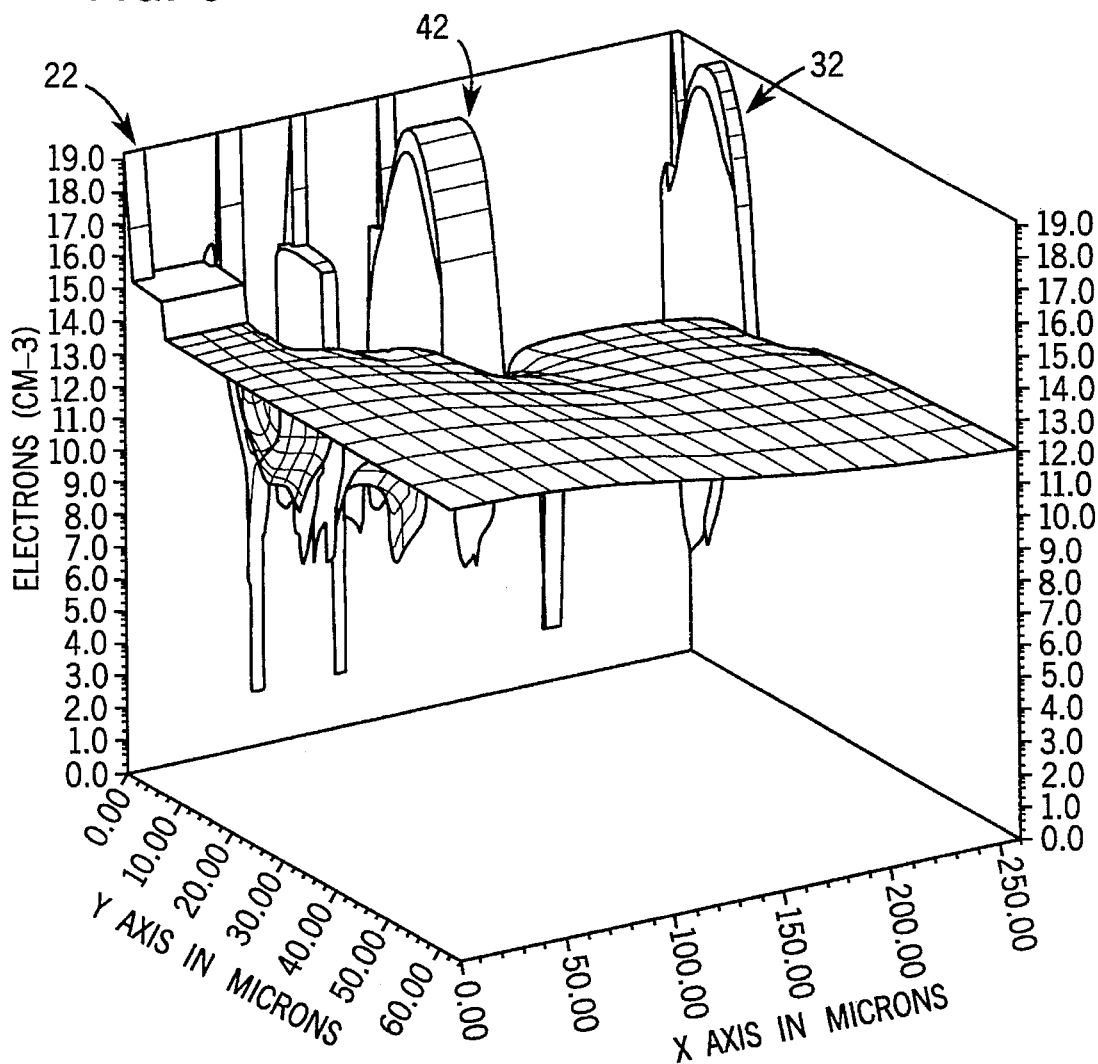
FIG. 6 is a three-dimensional plot of electron concentration ($cm^{-3}$) versus cross-sectional dimension (microns) in the device of FIGS. 1 and 2 when the injecting junction is operated with a forward voltage in the range of 0.52 volts; and, FIG. 7 is a three-dimensional plot of electron concentration ($cm^{-3}$) versus cross-sectional dimension (microns) in the device of FIGS. 1 and 2 when the injecting junction is operated with a forward voltage of 0.84 volts.

With reference to FIG. 6, with a drain/substrate forward-bias of 0.52 volts, a small but significant electron gradient is achieved across the moat. At this forward-bias voltage, sufficient levels of minority carriers are collected by the moat first doped region 42 such that the moat begins to self-bias. This results in a significant electron gradient and corresponds generally to point 52 of FIG. 3. Of particular interest in FIG. 6, the concentration gradient across a line normal to the surface beginning at a depth of approximately 10 μm is developed directly below the N-epi first doped region 42 of the moat. FIG. 6 shows a two order of magnitude lower electron concentration near the collector 32 with respect to the concentration beneath the power device of the first section 12.

High level injection- begins as the forward voltage on the drain/substrate diode approaches 0.6 volts which corresponds to point 54 of FIG. 3. In this mode of operation, the minority carrier concentration in the substrate (electrons) reaches a value close to or greater than the majority carrier concentration (holes).

Figure 7:
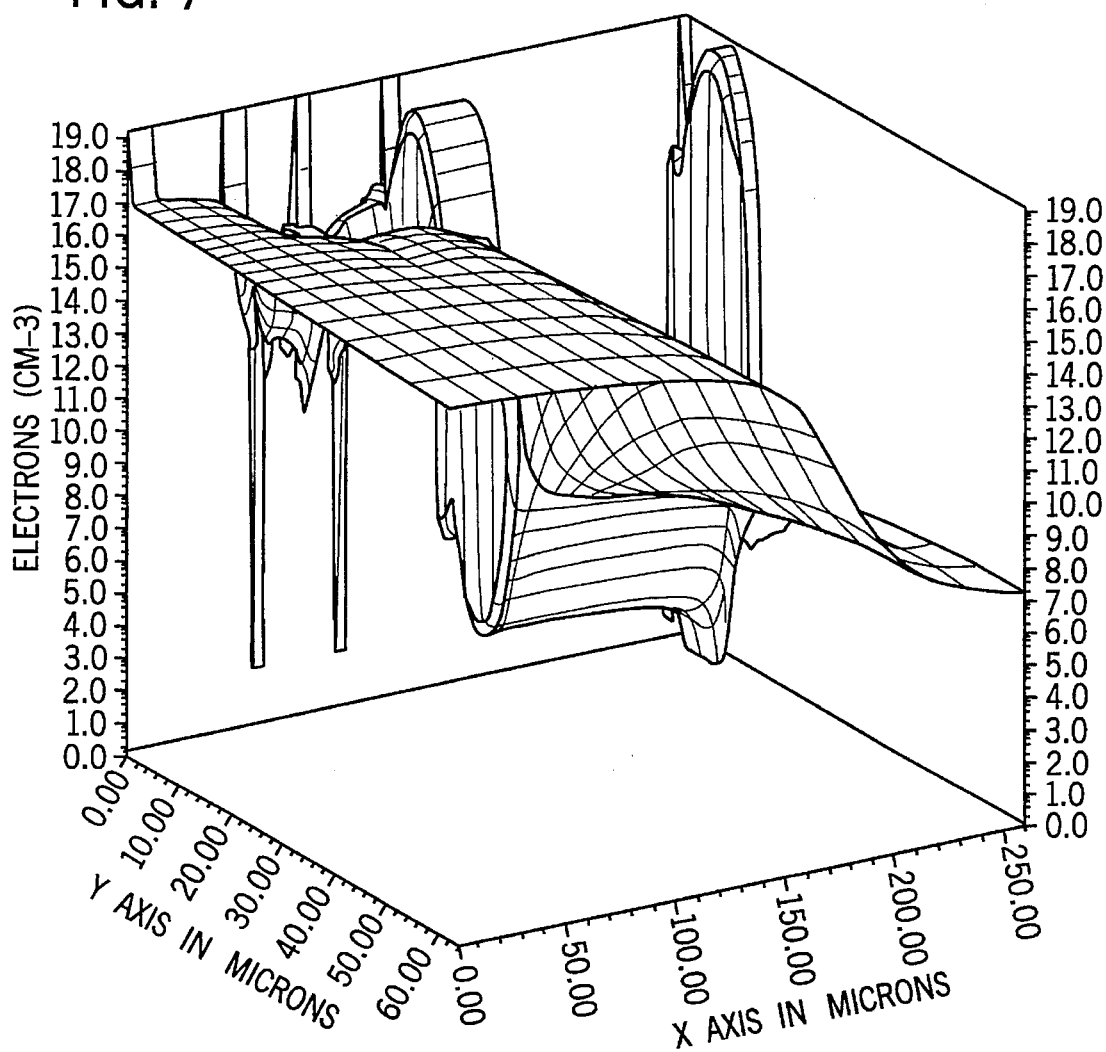

As the electron density increases above the acceptor doping concentration, so must the hole concentration. The increase in hole density modulates the conductivity of the substrate. The substrate effectively becomes more heavily doped and results in a decrease in the resistivity of the substrate on the power side of the moat first epi region. With sufficient modulation, the moat voltage is no longer dropped over the entire length of the substrate beneath the moat first epi region 42. The transition region, across which most of the self-biased moat voltage is sustained, becomes narrower thereby increasing the electric field. This also forces the carrier gradient to move along the moat epi/substrate junction away from the power device as more carriers build up in the power region. As minority carrier injection is increased still further, the transition region becomes narrower, increasing the electric field which, in turn, supports a larger electron concentration gradient. As illustrated in FIG. 7, with a forward-bias of 0.84 volts, the minority carrier concentration gradient becomes very sharp and positioned at the far right edge of the moat epi region. The electric field reaches a sufficiently high strength to cause a minority carrier concentration variation in the substrate of $10^{10}$ between the first section 12 and the second section 14.

These actions continue until the self-bias voltage of the moat nears an upper limit. The N-type epitaxial region 42 of the moat forms a diode with the substrate which tends to shunt an increasingly greater portion of the moat current as the injection is increased. This shunting occurs first near the surface of the substrate on the power section side of the moat and continues to sweep along the moat epi/substrate junction toward the collector section side at higher injection levels.

In the high injection mode of operation, there are three factors that limit moat efficiency. First, the electric field increase due to transition region narrowing is reduced due to limitations in the physical dimensions of the moat first doped region 42. Second, the electrical field ceases to increase due to shunting of the moat potential by the forward-biased epi 42/substrate 10 diode. Third, the epi 42/substrate 10 diode begins to share a significant portion of the moat current. This leaves only a percentage of the moat current to support the electric field in the transition region. These factors combine to cause a roll-off in moat efficiency past point 56. Therefore, at still higher junction levels, the parasitic collection current begins again to increase as seen by the upturn in the curve 50 past point 56 of FIG. 3.

Thus, a primary mechanism in blocking the parasitic current is the development of an electric field under the N-type epitaxial first doped region 42 separating the minority carrier injection section 12 from the section 14 that is to be protected. The flow of majority carriers, holes in the P-type substrate embodiment, flow directly below the N-type epitaxial first doped region 42 establishing a voltage drop. The voltage drop causes a resultant electric field between the two substrate sections. The electric field, in turn, establishes a minority carrier drift current in the direction of the injecting element and away from the sensitive parasitic collector. Typically, a voltage range for the moat potential is from just below ground or 0 volts to about 1 volt negative. The diode formed by the N-type epitaxial doped region 42 and a region 70 of the P-type material on the side of the injecting device becomes active or forward-biased with increasingly negative moat voltage, thus limiting the moat voltage. Preferably, the width of the moat first doped region 42 is selected relative to the resistance of the substrate and the levels of injected current such that a voltage drop of ½ to 1 volt, and preferably closer to 1 volt negative, is achieved.

The control of parasitic minority carriers is reduced in applications where low level injection calls for wide N-type doped regions. The electric field strength is inversely proportional to doped region width. Because the potential does not exceed about 1 volt negative, the electrical field decreases with increasing N-type moat doped region width and results in lower minority carrier drift currents. At high level minority carrier injections, the width of the N-type moat doped region 42 is less critical. During high level injection, when the minority carrier concentration meets or exceeds the majority carrier concentration, conductivity modulation of the substrate material occurs. Because these carriers are concentrated near the injecting element, resistance of the substrate across the N-type moat doped region decreases along that portion of the doped region 42 towards the injection device. The electric field is enhanced because the voltage is now supported across a shorter distance. This action continues to sharpen the transition region and increase the electric field strength. It is in the high injection mode that minority carrier control is most effective.

Of course, the self-biased moat arrangement can be used with other junction isolated processes, such as both epitaxial-type bipolar processes and twin well CMOS processes. Although the present technique is advantageous with processes that are designed to withstand high voltages in the range of 200 to 1000 volts or more where parasitic currents are a significant problem, advantages are had with voltage ratings on the order of 5 to 1000 volts, depending on the doping of the substrate. At the higher dopant concentrations associated with low voltage processes, minority carrier lifetimes are shorter, hence parasitic transistor gains are reduced. Although the self-biased moat technique is effective over a wide range of voltage ratings, the parasitic current problem is greater with high voltage processes.

In a preferred embodiment, the power circuit includes two bilaterally connected MOSFETs which are each forward-biased and inject minority carriers during one half of each AC line cycle. In such an application, a constant supply of minority carriers is available. In other applications, the source of minority carriers would be intermittent or pulsed. If the pulses are spaced too far apart, an internal or external capacitance can be connected to the moat to maintain the self-bias potential between pulses.

In one alternate embodiment, the N-type moat first doped region is broken up into multiple small tubs provided that the distance between P-type substrate areas is maintained such that at least the first and last N-type tubs are electrically connected to the P+ moat area. In another embodiment, non-critical circuit elements are placed in the N-type epi tub or tubs of the moat first doped region thus utilizing otherwise wasted silicon area. In another embodiment, the use of multiple moats constructed in series fashion could also be effective in extending the useful current range of the technique. In another alternate embodiment, a return path of majority carriers through the substrate is controlled with an external or integrated device such that the parasitic current control is actively adjusted. In another alternate embodiment, the bias to the moat device is controlled by an internal or external voltage supply directly.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of controlling parasitic currents in a semiconductor device that includes a substrate and a moat assembly, the substrate defining a first section having a plurality of doped regions that define power devices, and a second section having at least one doped region, the moat assembly including a first doped moat region of the substrate extending between said doped regions of the first and second sections, a second doped moat region on a second section side of the first doped moat region which second doped moat region is doped to receive a flow of majority charge carriers from the substrate, and an electrical conductor connecting the first and second doped moat regions, the moat assembly being isolated from ground, the first section and fixed voltage sources, the method comprising:

biasing the doped regions of the first and second sections at least intermittently such that minority carriers are injected into the substrate causing a parasitic minority carrier current flow from the first section to the second section causing the doped regions of the first and second sections to function as a parasitic device;

collecting a portion of the minority carriers in the first doped moat region;

establishing a current flowing through the electrical conductor from the first doped moat region to the second doped moat region, and flowing through the substrate under the first doped moat region from the first section toward the second doped moat region to establish a voltage bias that inhibits and reduces minority carrier flow from the first section to the second section.

2. The method as set forth in claim 1 wherein the moat assembly first doped region has a width in a direction of the parasitic current flow and the substrate has a resistance per unit dimension below the self-biased moat first doped region, the moat assembly first doped region width and the substrate resistance being such that:

the majority charge carriers flowing under the moat assembly first doped region from the first section to the moat assembly second doped region generate a voltage drop of ½ to 1 volt negative below the moat assembly first doped region.

3. The method as set forth in claim 2 wherein the voltage drop induces a minority carrier drift current causing a negative minority carrier gradient from the first section to the second section.

4. The method as set forth in claim 3 wherein the minority carrier gradient reduces a minority carrier density in the second section.

5. The method as set forth in claim 2 wherein a bias potential of at least 0.52 volts is applied between a minority carrier injecting region of the power devices and the substrate.

6. The method as set forth in claim 2 wherein a bias potential of at least 0.84 volts is applied between a minority carrier injecting region of the power devices and the substrate.

7. The method as set forth in claim 2 wherein a forward-bias potential is applied between a minority carrier injecting doped region and the substrate such that:

a minority carrier concentration gradient is created in the substrate across the moat assembly first doped region.

8. The method as set forth in claim 7 further including increasing the forward-bias potential, increasing a majority carrier concentration in the substrate under the power devices until the resistivity of the substrate is decreased adjacent a power device side of the moat assembly first doped region.

* * * * *